(12) United States Patent
Eddowes

(10) Patent No.: US 9,344,202 B2
(45) Date of Patent: May 17, 2016

(54) RECEIVED SIGNAL QUALITY INDICATOR

(71) Applicant: FRONTIER SILICON LIMITED, Cambridgeshire (GB)

(72) Inventor: David Eddowes, Cambridgeshire (GB)

(73) Assignee: FRONTIER SILICON LIMITED, Cambridge, Cambridgeshire (GB)

( * ) Notice: Subject to any disclaimer, the term of this patent is extended or adjusted under 35 U.S.C. 154(b) by 0 days.

(21) Appl. No.: 14/380,673

(22) PCT Filed: Feb. 21, 2013

(86) PCT No.: PCT/GB2013/050421
§ 371 (c)(1),
(2) Date: Aug. 22, 2014

(87) PCT Pub. No.: WO2013/124660
PCT Pub. Date: Aug. 29, 2013

(65) Prior Publication Data
US 2015/0044980 A1   Feb. 12, 2015

(30) Foreign Application Priority Data
Feb. 24, 2012   (GB) .................................. 1203247.0

(51) Int. Cl.
*H04B 1/06*   (2006.01)
*H04B 17/00*   (2015.01)
(Continued)

(52) U.S. Cl.
CPC ......... *H04B 17/0065* (2013.01); *H03G 3/3068* (2013.01); *H04B 17/0057* (2013.01); *H04B 1/109* (2013.01); *H04B 1/1027* (2013.01);
(Continued)

(58) Field of Classification Search
CPC .... H04B 1/109; H04B 1/1027; H04B 1/1045; H04B 17/309; H04B 17/345; H04B 17/373; H03G 3/3068
USPC ........ 455/245.1, 245.2, 250.1, 296, 308, 311, 455/226.2
See application file for complete search history.

(56) References Cited

U.S. PATENT DOCUMENTS 5,483,691 A * 1/1996 Heck ...................... H04B 1/109
375/345
5,722,061 A * 2/1998 Hutchison, IV .......... H03F 3/72
455/226.2

(Continued)

FOREIGN PATENT DOCUMENTS

WO   WO 2009/049218 A1   4/2009

OTHER PUBLICATIONS

International Search Report issued on Apr. 18, 2013 for International Application No. PCT/GB2013/050421.

(Continued)

*Primary Examiner* — Duc M Nguyen
(74) *Attorney, Agent, or Firm* — Knobbe Martens Olson & Bear, LLP

(57) ABSTRACT

The invention generally relates to a method of indicating signal quality at an input to a radio receiver, and to a radio receiver. In particular, such a method is described, wherein a receiver comprises first (RF) and second (IF) gain control loops respectively using first and second gain control signals, and comprising indicating signal quality dependent on said first gain control signal and said second gain control signal. In an embodiment, a difference between the first and second gain control signals is used to indicate presence of interference and/or received signal strength.

24 Claims, 16 Drawing Sheets

(51) Int. Cl.
*H03G 3/30* (2006.01)
*H04B 1/10* (2006.01)
*H04B 17/21* (2015.01)
*H04B 17/23* (2015.01)
*H04B 17/318* (2015.01)
*H04B 17/345* (2015.01)

(52) U.S. Cl.
CPC ................. *H04B17/21* (2015.01); *H04B 17/23* (2015.01); *H04B 17/318* (2015.01); *H04B 17/345* (2015.01)

(56) References Cited

U.S. PATENT DOCUMENTS

| | | | | |
|---|---|---|---|---|
| 5,929,811 | A * | 7/1999 | Rilling | H01Q 3/2605 342/375 |
| 8,050,643 | B1 * | 11/2011 | Wu | H03G 3/3068 455/234.1 |
| 8,428,535 | B1 * | 4/2013 | Cousinard | A42B 3/225 455/226.2 |
| 8,718,207 | B2 * | 5/2014 | Chen | H04B 1/109 375/345 |
| 2002/0142745 | A1 * | 10/2002 | Kang | H03G 3/3068 455/232.1 |
| 2003/0064692 | A1 * | 4/2003 | Shi | H03F 1/32 455/232.1 |
| 2007/0082639 | A1 * | 4/2007 | Lindstrom | H03G 3/3068 455/226.3 |
| 2007/0243843 | A1 * | 10/2007 | Shalash | H03G 3/3068 455/234.1 |
| 2008/0153445 | A1 | 6/2008 | Sandner et al. | |
| 2009/0209220 | A1 | 8/2009 | Beck et al. | |
| 2010/0284541 | A1 | 11/2010 | Taira | |
| 2012/0288043 | A1 * | 11/2012 | Chen | H04B 1/109 375/345 |

OTHER PUBLICATIONS

Search Report issued Jun. 23, 2012 in priority application No. GB 1203247.0.

* cited by examiner

RECEIVED SIGNAL QUALITY INDICATOR

CROSS-REFERENCE TO RELATED APPLICATIONS

This application is the U.S. National Phase under 35 U.S.C. §371 of International Application No. PCT/GB2013/050421, filed Feb. 21, 2013, designating the United States and published in English on Aug. 29, 2013 as WO 2013/124660, which claims priority to United Kingdom Application No. 1203247.0, filed Feb. 24, 2012.

FIELD OF THE INVENTION

This invention generally relates to methods of indicating signal quality at an input to a radio receiver, radio receivers, and further generally relates to a computer program to perform the method and to a signal processor programmed to perform the method.

BACKGROUND TO THE INVENTION

A radio receiver (e.g., AM, FM, DAB, etc.) generally has two AGC (Automatic Gain Control) loops, one to control an intermediate frequency signal level and the other to control the signal level into a baseband demodulator.

FIG. 1a shows a functional block diagram for such a radio receiver comprising RF input IP1, voltage controlled amplifier A1, mixer M1, local oscillator input LO1, power detector PD1, RF gain control loop Loop1, channel filter F1, mixer M2, local oscillator input LO2, voltage controlled amplifier A2, an IF output OP1 to a baseband device, an IF Gain Control Loop Loop2, a link D1 between the loops, and a further input IP2 that provides a gain control voltage from the Baseband Device. More specifically, the radio receiver may consist of the following:

a) a low noise amplifier A1 whose gain is controlled by an internal voltage Vrfagc;
b) a first mixer M1 which "down converts" the RF input to a lower frequency, e.g., DC (0 Hz) for DAB or 124 kHz for FM;
c) a channel filter F1 which only allows the selected frequencies to pass through and attenuates any unwanted frequencies;
d) a second mixer M2 which "up converts" the output from the channel filter to a suitable frequency for the subsequent signal processing, e.g., to 2.048 MHz for DAB or 2.172 MHz for FM; and
e) a voltage controlled amplifier A2 to provide an output to a signal processor/demodulator (not shown; e.g., baseband signal processor programmed to demodulate) and controlled by a second internal voltage Vifagc.

The link between the RF and IF control loops is generally provided to limit the reduction in baseband gain that occurs without also reducing the RF gain. Preferably, both amplifiers thus operate in the intended, preferably linear, regions of their voltage-controlled gain characteristics over as wide a range as possible, and/or so that the amplifier A1 does not reach its maximum gain under normal operation. The link is shown in FIG. 1a using a conventional diode symbol illustratively to indicate a digital diode, i.e., circuitry having a programmable voltage limit as compared to the non-programmable limit provided by the forward bias voltage of a conventional p-n diode.

A Received Signal Strength Indicator (RSSI) may be implemented on the basis of detecting the control voltage to the second amplifier (Vifagc). In order to reduce the effects of interference on RSSI however, the receiver may have a "tracking" filter at the RF input IP1 prior to the low noise amplifier A1. The purpose of this filter is to pass the wanted signal and reject any interfering signal. (The filter is called a "tracking" filter because it "tracks" the wanted signal frequency).

Such a tracking filter is however a low order filter and more effective at removing interfering signals that are at a frequency far away from the wanted signal.

Consequently, the field of radio receivers continues to provide a need to more reliably indicate quality of the received signal, preferably to more accurately indicate the signal strength of the wanted signal being received. Thus, it is desired to allow the presence an interferer to be detected and compensated for, in particular to provide an improved "Received Signal Strength Indicator" (RSSI) function. Similarly, there is a need in the field of radio receivers to indicate when interference may be present, preferably indicating the power of the interference.

SUMMARY

According to a first aspect of the present invention, there is provided a method of indicating signal quality at an input to a radio receiver, the radio receiver comprising: a first gain control loop having a first amplifier coupled to amplify a radio signal from a receiver input and having a first gain control input to receive a first gain control signal to control gain of said first amplifier, the first gain control loop having an output to output an intermediate signal, said first gain control loop further comprising a detector coupled to reduce said first amplifier gain when a level of said intermediate signal exceeds a threshold; and a second gain control loop having a second amplifier to amplify a signal on an input to said second amplifier, said second amplifier input coupled to said intermediate signal output, said second amplifier having a second gain control input to receive a second gain control signal to control gain of said second amplifier, wherein said first and second gain control inputs are coupled to limit a difference between the first and second gain control signals to be less than or substantially equal to a limit value, the method comprising: indicating said signal quality on the basis of said first gain control signal and said second gain control signal.

Preferably, the detector comprises a power detector and the level of the intermediate signal is a power level. The first gain control signal of an embodiment may be referred to as Vrfagc that is input to a first (RF) amplifier of the first gain control loop, and the second gain control signal may be referred to as Vifagc that is input to a second (IF) amplifier, which is provided in the second gain control loop. The intermediate signal may be output to the second gain control loop via a filter, the filter having a frequency characteristic including a passband to pass the wanted radio signal, the frequency characteristic however rejecting components arising in the intermediate signal (which may result from mixing for the above down conversion) due to the interference.

Advantageously, a divergence in the difference between the gain control signals away from the limit value may be indicative of out-of-band interference at the receiver input. Furthermore, values of the first and second gain control signals may allow estimation of the wanted in-band received power as opposed to simultaneously received interference. Thus, an embodiment may allow signal quality to be indicated to the user, for example indicating low or high out-of band interference, and/or strength of such interference and/or strength of a wanted, i.e., in-band, radio signal. Moreover, appropriate action may be taken when the wanted signal quality is low and/or the interference high, such as to estimate and display the received strength of the wanted, i.e., in-band, received signal and/or of the out-of-band interference, and/or to adjust an audio volume, adjust filtering at the receiver input and/or to increase a transmitter output level.

In line with the above, the method may comprise: comparing a said difference between said first gain control signal and said second gain control signal to said limit value; and said indicating said signal quality dependent on a result of said comparison.

For example, the indicating said signal quality may comprise indicating presence of interference at said radio receiver input when said difference is not substantially equal to said limit value, e.g. the magnitude of the voltage difference across the link is less than the limit value ('substantially' meaning, e.g., exactly equal to or within 1, 2, 5 or 10% of the relevant value, throughout this application). Conversely, said indicating said signal quality may comprise indicating absence of interference at said radio receiver input when said difference is substantially equal to said limit value.

Rather than merely indicating presence of interference, the method may comprise indicating strength of interference at said radio receiver input, said indicating said strength dependent on said first and second gain control signals, wherein said interference comprises RF power received outside a frequency range. Additionally or alternatively, the method may comprise indicating strength of RF power received in a frequency range at said radio receiver input, said indicating said strength dependent on said difference. In either case, the said frequency range is preferably, or is preferably within, 168 MHz-240 MHz, 1452 MHz-1492 MHz or 87 MHz to 108 MHz, more preferably said frequency range is:

a DAB channel frequency band for example having a centre frequency of substantially 218.640, 220.352 MHz, 1464.944 MHz or 1468.368 MHz and/or width of substantially 1.537 MHz; or
   an FM channel frequency band for example having a centre frequency of substantially 92.5 MHz and/or a bandwidth of substantially 100 kHz or 200 kHz.

Moreover, in any embodiment of the present invention, a frequency range as described above may represent a band of 'wanted'/'in-band' frequencies, so that interference may be defined as any frequency/ies falling out outside the frequency range.

The above comparing of the difference to the limit value may comprise detecting a value of said first gain control signal and a value of said second gain control signal and comparing said detected first and second gain control signal values. The limit value may be provided using a reference voltage, for example a forward bias voltage of a pn-junction diode. An example value is 0.44V. In practice, the difference between Vrfagc and Vifagc may be maintained exactly constant under normal conditions, or may be maintained within, e.g., +−1, 5 or 10% of the preferably constant limit value.

In order to more accurately indicate the strength of interference or of the wanted signal strength in the presence of such interference, an adjustment may be made. For example, there may further be provided the method comprising: when said difference is not substantially equal to said limit value, indicating signal strength of the received wanted (i.e., in-band) radio signal by: detecting a value of said first gain control signal and a value of said second gain control signal; calculating an adjusted value of said second gain control signal on the basis of said detected value of said first gain control signal and said detected value of said second gain control signal; and determining said signal strength on the basis of said adjusted value. On the other hand, the method may comprise: detecting a value of said second gain control signal; and when said difference is substantially equal to said limit value, determining said signal strength directly on the basis of said detected value of said second gain control signal.

Thus, the way in which the strength of a received wanted ("in-band") signal is determined may be dependent on whether the receiver is operating with or without interference. For operation without interference, an RSSI may be determined directly by the second gain control signal, whereas for operation with interference, an adjusted value of the second gain control signal may be calculated, to arrive at a specific estimate of the received wanted signal.

The calculating of said adjusted value of said second gain control signal may further comprise: calculating an adjusted value of said first gain control signal on the basis of said adjusted value of said second gain control signal and said limit value; and comparing said adjusted value of said first gain control signal to a knee value of said first amplifier, said knee value being a control signal value at which a gain slope (e.g., dB/V) of said first amplifier changes with increased control signal value (e.g., there is a reduction and/or discontinuity in gain slope, e.g. a dB/V reduction of more than 10, 20 or 50%). The knee value of the first amplifier dB/V characteristic may for example be 1.83V (this corresponding to the knee at about −80 dBm in FIG. 2, and the corresponding use of the value 1.83V in FIG. 5), but will depend on the particular amplifier in use. Where said adjusted value of said first gain control signal is greater than said knee value, determining said signal strength may be performed on the basis of said adjusted value that has been calculated on the basis of said adjusted value of said second gain control signal. On the other hand, when said adjusted value of said first gain control signal is less than said knee value, the method may involve calculating a further adjusted value of said second gain control signal based on said detected values of said first and second gain control signals, said calculating said further adjusted value based on a ratio of gain slopes of said first and second amplifiers; and said determining said signal strength performed on the basis of said further adjusted value.

There may further be provided the method comprising: when said difference is not substantially equal to said limit value, determining an interference strength by calculating an adjusted value of said second gain control signal on the basis of a detected value of said first gain control signal and a detected value of said second gain control signal and determining said interference strength on the basis of said adjusted value.

Thus, the strength of the interference may be determined dependent on the second control signal. This can be considered as the corollary of the above method of calculating a wanted received signal strength. In either case, the first and/or second gain control signals are detected and adjusted where appropriate, and corresponding gains of the amplifiers may then be calculated and the desired wanted or interference signal strength determined.

Thus, an above method may comprise detecting a value of said first gain control signal and a value of said second gain control signal; calculating said gain of said first gain control loop and said gain of said second gain control loop on the basis of said detected values of said first and second gain control signals; determining power of a wanted and/or interference signal at said radio receiver input on the basis of said calculated gains.

A computer program may be provided to perform any method as described above. Similarly, a signal processor programmed to perform any such method may be provided.

According to a second aspect of the invention, there is provided a radio receiver having an input to receive a radio signal, the receiver comprising: a first gain control loop having a first amplifier coupled to amplify a radio signal from said receiver input and having a first gain control input to receive a first gain control signal to control gain of said first amplifier, the first gain control loop having an output to output an intermediate signal, said first gain control loop further comprising a detector coupled to reduce said first amplifier gain when a level of said intermediate signal exceeds a threshold; a second gain control loop having a second amplifier to amplify a signal on an input to said second amplifier, said second amplifier input coupled to said intermediate signal output, said second amplifier having a second gain control input to receive a second gain control signal to control gain of said second amplifier; a voltage limiter coupled between said first and second gain control inputs to limit a difference between the first and second gain control signals to be less than or substantially equal to a limit value; a signal quality output circuit coupled to said first and second gain control signals and configured to indicate signal quality at said radio receiver input on the basis of said first and second gain control signals.

There may further be provided the receiver comprising: a comparator to compare a difference between said first and second gain control signals to said limit value; and said signal quality output circuit configured to indicate said signal quality on the basis of said comparison.

Thus, consistent with the above methods, such a signal quality indicator circuit may be for example a received signal strength indicator (RSSI) circuit for indicating the strength of a wanted, i.e., in-band, signal as opposed to out-of-band interference.

An embodiment may be configured such that, in practice, the condition of the intermediate signal level reaching or exceeding the threshold corresponds to presence of interference. Preferably, the first gain control signal tracks the second gain control signal in the absence of interference, whereas the difference deviates from the limit value in the presence of interference. Thus, an embodiment of the receiver may monitor such tracking and indicate that interference is present (absent) on the basis of a determination the tracking has ceased (is occurring).

The second amplifier may receive the intermediate signal via a filter and/or mixer (e.g., M2) coupled between the first gain control loop and the second gain control loop.

(As in any receiver embodiment, the detector is preferably a power detector. Furthermore, the detector input is preferably coupled to the output of a down-conversion mixer in the first gain control loop. Furthermore, any amplifier mentioned herein may be provided for example as a series of amplifiers in combination, one or more of which may be voltage controlled, or as a fixed or variable gain block together with a voltage controlled attenuator).

Preferably, the radio receiver comprises: a detector to detect a value of said second gain control signal; said signal quality indicator circuit (e.g., a signal processor, which may further comprise a demodulator—preferably a baseband demodulator) arranged to, when an output of said comparator indicates that said difference is substantially equal to said limit value (this may correspond to absence of interference, calculate signal strength of a wanted radio signal at said radio receiver input directly on the basis of said detected value of said second gain control signal and to indicate said calculated signal strength.

Additionally or alternatively, the radio receiver may comprise: a detector to detect a value of said first gain control signal; said signal quality indicator circuit arranged to, when an output of said comparator indicates that said difference is not substantially equal to said limit value (this may correspond to presence of interference), calculate an adjusted value of said second gain control signal on the basis of detected values of said first and second gain control signals, to calculate signal strength of a wanted received radio signal on the basis of said adjusted value and to indicate said calculated signal strength, According to a third aspect of the invention, there is provided a radio receiver having an input to receive a radio signal, the receiver comprising: a first gain control loop having a first amplifier coupled to amplify a radio signal from said receiver input and having a first gain control input to receive a first gain control signal to control gain of said first amplifier, the first gain control loop having an output to output an intermediate signal, said first gain control loop further comprising a detector coupled to reduce said first amplifier gain when a level of said intermediate signal exceeds a threshold; a second gain control loop having a second amplifier to amplify a signal on an input to said second amplifier, said second amplifier input coupled to said intermediate signal output, said second amplifier having a second gain control input to receive a second gain control signal to control gain of said second amplifier; a voltage limiter coupled between said first and second gain control inputs to limit a difference between the first and second gain control signals to be less than or substantially equal to a limit value; a detector to detect a value of said first gain control signal; a detector to detect a value of said second gain control signal; and a signal quality indicator circuit arranged to, when said detector coupled to reduce said first amplifier gain indicates said level of said intermediate signal exceeds said threshold, calculate an adjusted value of said second gain control signal on the basis of said detected values of said first and second gain control signals and to calculate signal strength of said received radio signal on the basis of said adjusted value.

Thus, in comparison to the second aspect that may use comparison of Vrfagc and Vifagc to indicate interference presence and thus trigger calculation of an adjusted value, the third aspect may in an embodiment use the detector output state to trigger such a calculation.

As in other aspects described above, the second loop may receive the intermediate signal via a filter and/or mixer (M2), and/or the detector input may be coupled to the output of a mixer (M1) of the first loop. The RSSI indicator circuit may be provided within a signal processor, which may also be provide together with a demodulator.

There may further be provided the radio receiver, wherein said first gain control loop comprises: a mixer arranged to frequency down convert said radio signal amplified by said first amplifier and to output said down converted radio signal as said intermediate signal.

There may further be provided the radio receiver, wherein said circuitry comprises: a mixer arranged to frequency up convert said intermediate signal.

There may further be provided the radio receiver, wherein said circuitry comprises a filter having a passband to reject frequency components arising due to interference, the filter preferably coupled between the intermediate signal output and said mixer arranged to frequency up convert, wherein said interference comprises frequencies outside a frequency band, said frequency band preferably a DAB or FM channel frequency band. Such a filter may be placed at the receiver RF input for example as a tracking filter, or may be a channel filter for example positioned to receive an intermediate signal as shown in FIGS. 1a (ee F1) and 1b. Preferably, the filter has a frequency characteristic comprising at least one passband that passes signal frequencies arising from reception of a wanted radio signal at the receiver input, while substantially blocking any frequency outside the at least one passband, in particular any such frequency arising due to the presence of interference at the receiver input (n.b. such frequencies may result from frequency mixing in the first gain control loop, e.g., by mixer M1).

There may further be provided the radio receiver, further comprising: a demodulator to demodulate an output of said second gain control loop, said second gain control loop comprising a level detector to detect a level of said output, the second gain control loop arranged to maintain said output level substantially constant. The output level detector may be a power or voltage detector, and may be provided in a demodulator circuit/chip of the receiver.

The above optional features of the third aspect are further applicable to the receiver of the second aspect.

Preferred embodiments are defined in the dependent claims. Furthermore, any one or more of the above aspects and optional features of the preferred embodiments may be combined in any permutation.

BRIEF DESCRIPTION OF THE DRAWINGS

For a better understanding of the invention and to show how the same may be carried into effect, reference will now be made, by way of example, to the accompanying drawings, in which.

DETAILED DESCRIPTION OF PREFERRED EMBODIMENTS

Figure 1A:
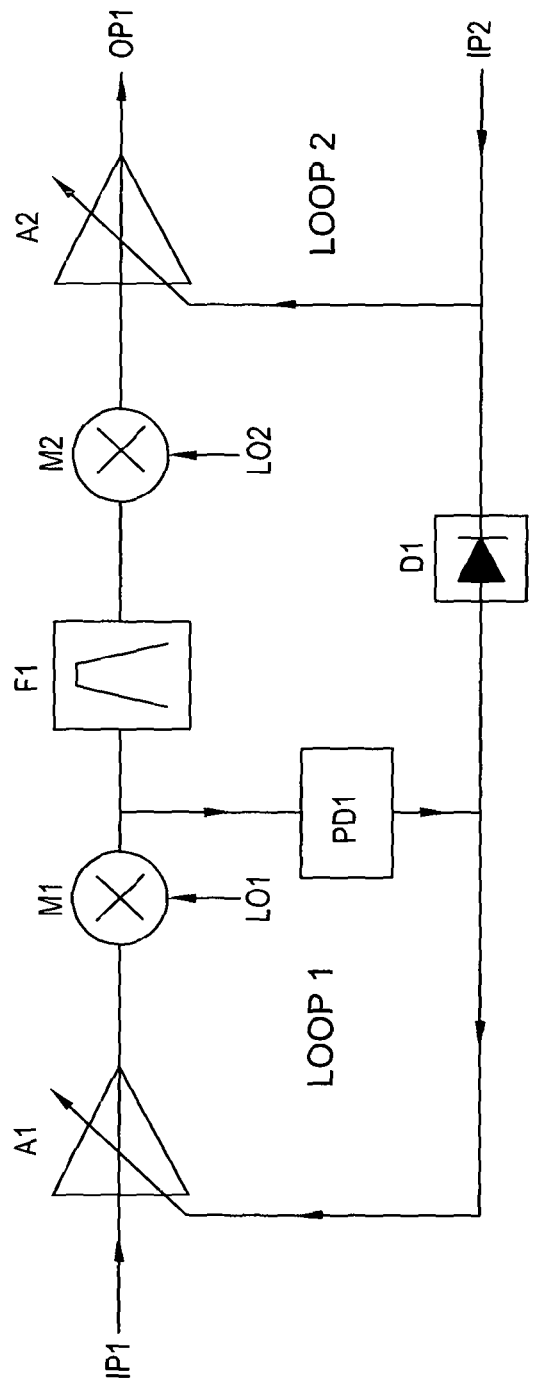
FIG. 1a shows circuitry of a radio receiver.
Figure 1B:
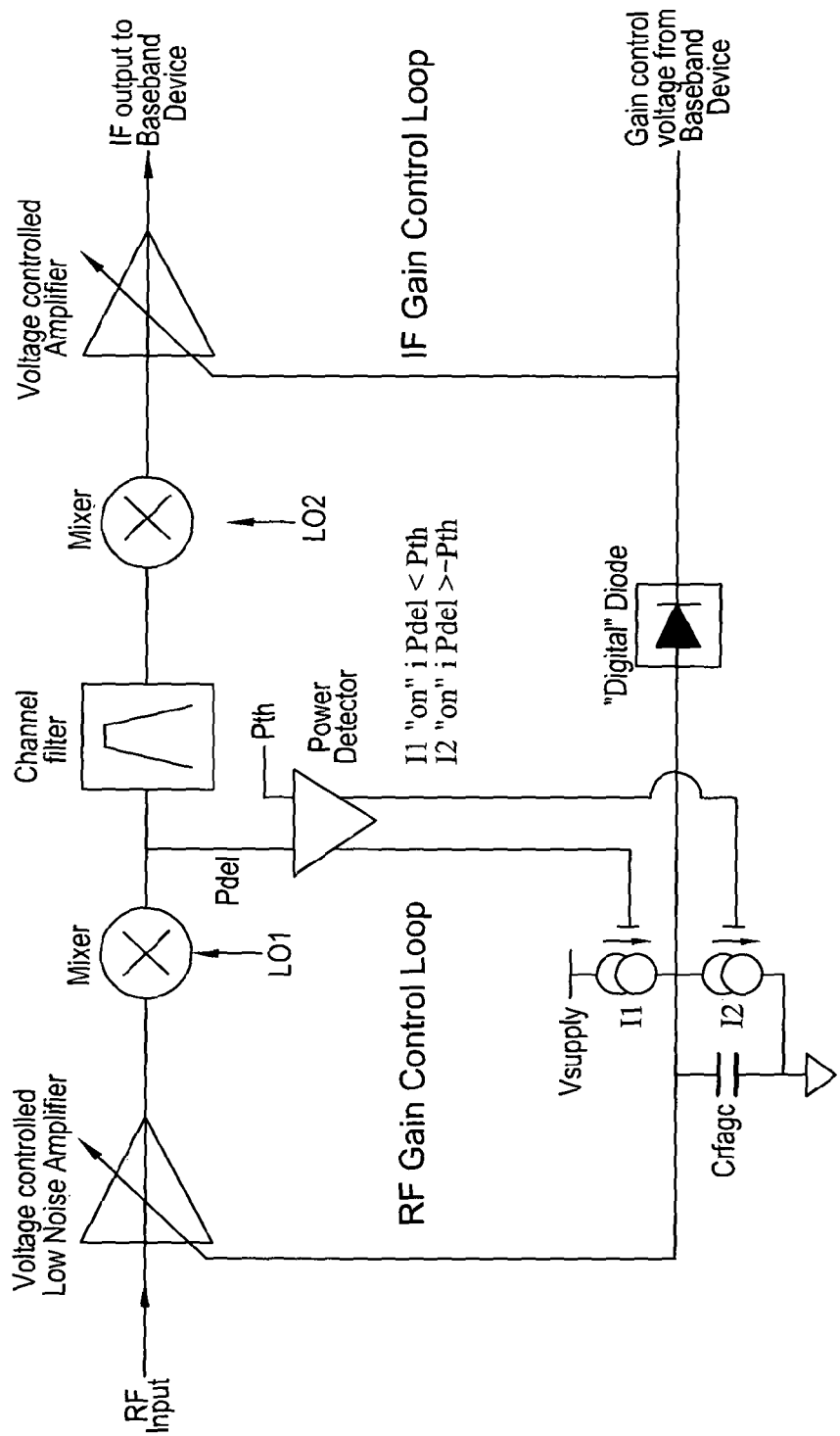
FIG. 1b shows the radio receiver circuitry of FIG. 1a, including example implementational details relating to the power detector and provision of the first gain control signal (Vrfagc; Vifagc being a second gain control signal)

Regarding the radio receiver circuits shown in FIGS. 1a and 1b, the features IP1, Loop1, Loop2, A1, A2, Vrfagc, Vifagc and PD1 generally correspond a radio receiver input, first gain control loop (RF gain control loop), second gain control loop (IF gain control loop), first (RF) amplifier, second (IF) amplifier, first gain control signal, second gain control signal and detector (preferably a power detector), respectively.

In such a circuit, the occurrence of interference may result in a signal level (e.g. voltage or power) at the input to the detector exceeding the detector threshold. In response, the detector varies Vrfagc to thus reduce gain of the first amplifier A1, e.g., by the detector activating the current source I2 of FIG. 1b. In turn, the signal level at the input to the second amplifier A2 is reduced, this reduction being detected by a level detector (preferably in the baseband device) of the second gain control loop that then acts to increase the second amplifier gain. Thus, the occurrence of interference causes a deviation in the difference between the voltage control signals, and may have the effect of changing the gains of the first and second amplifiers; the wanted input power and/or interference power at the received input may be calculated on the basis of the changed gains.

The receiver is preferably configured such that the detector threshold is never reached under expected, i.e., normal, substantially interference-free, operating conditions. The indicating or detecting of interference may then be carried out on the assumption that no 'wanted' received radio signal alone will cause the detector to change state.

The detector threshold may correspond to, e.g., to the level produced by a −70, −60, −50 or −40 dBm signal at the receiver RF input (more specifically, e.g., −52 dBm or −63 dBm) with maximum RF gain (e.g., substantially 90, 95, 105 or 110 dB). (It is noted that the threshold may be variable depending on the operating state of the receiver circuit when the threshold is reached/exceeded, e.g., depending on actual first (RF) amplifier gain at that time. Thus, the receiver input RF power corresponding to the detector threshold may change depending on the actual operating state of the receiver; as wanted power is increased, there may come a time when the RF gain starts to decrease and so the input power corresponding to the RF detector threshold will increase).

Generally speaking, the interference may consist of any frequencies received outside a wanted frequency band. Thus, a wanted part of a total signal at a receiver input may be referred to as 'in-band' whereas an interference part may be referred to as 'out-of-band'. More specifically, interference may be, e.g., outside 168 MHz-240 MHz (VHF-III; DAB band 3), 1452 MHz-1492 MHz (DAB L-band) or 87 MHz to 108 MHz (FM), e.g., interference may be:

for DAB, any signal outside a single DAB channel (e.g., having a bandwidth of substantially 1.537 MHz when considering an overall DAB OFDM channel comprising OFDM subcarriers at, e.g., 1 kHz spacing). Each such channel may have a bandwidth and central frequency defined by an ETSI standard (e.g., ETSI EN 300 401 V1.4.1 for the original DAB specification, or ETSI TS 102 563 v1.1.1 for DAB+, each of which standards are incorporated herein by reference). The central frequency of such a DAB channel may be at, e.g., 174.928, 176.640, 178.352 . . . 201.072, 202.929 . . . 218.640, 220.352 . . . 237.4448, or 239.200 MHz, whereas for L-Band terrestrial DAB, channel centre frequencies may be at, e.g., 1452.960 MHz, 1454.672 MHz . . . 1464.944 MHz, 1468.368 MHz . . . 1476.928 MHz, 1478.640 MHz.

for FM, any signal outside an FM channel band (e.g. bandwidth 100 kHz or 200 kHz and/or having bandwidth and central frequency as defined by an ITU standard such as "Transmission standards for FM sound broadcasting at VHF". ITU Rec. BS.450 which is incorporated herein by reference).

Figure 1C:
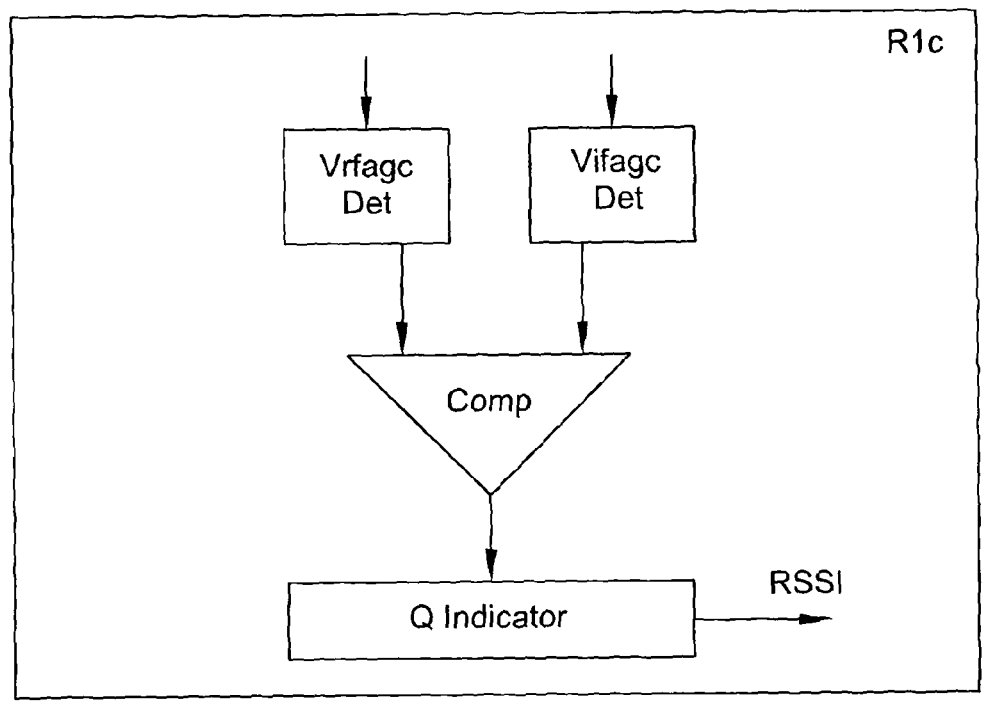
FIG. 1c shows elements of radio receiver circuitry for outputting a signal quality, e.g., RSSI indicator, based on a comparison of control voltages, and which may be combined with FIG. 1a or 1b.

In view of the above, a deviation in the difference between the voltage control signals may be used to indicate signal quality. For example, in an embodiment such as is shown in FIG. 1c, a receiver R1c may output a signal quality indicator for example in the form of an RSSI indicator, preferably to indicate the presence of sufficient received RF power in the wanted frequency band to provide an acceptable user-experience, more preferably to indicate the strength of the received RF power in the wanted frequency band. This may be achieved by detectors VrfagcDet and VifagcDet detecting RF and IF gain control signals, respectively, a comparator (Comp) comparing the detection results, a signal quality indicator circuit outputting a signal quality indication on the basis of the comparison result.

In an embodiment, the intermediate signal may be passed to the second control loop via a filter and/or a further mixer, the filter having a frequency characteristic including a passband, the passband to pass frequencies of the (wanted) radio signal, the frequency characteristic to substantially block intermediate signal components resulting from the interference. Moreover, frequency component(s) resulting from mixing the unwanted interference signal in an RF stage frequency down conversion mixer (see below, and M1 of FIG. 1a) may be substantially blocked by a filter (e.g., F1) provided subsequent to that mixer, e.g., to filter the intermediate signal prior to input to a further mixer (M2) and/or the second (IF) control loop. In this case, the input power to the second control loop may be lower than if the interference power was instead in the frequency range of the wanted radio signal. However, any effect on the difference between Vrfagc and Vifagc caused the channel filter reducing input power to the IF control loop relative to the output power of the RF control may be sufficiently low to be disregarded.

In a practical embodiment, the circuitry of FIG. 1a or 1b, possibly with the exception of the capacitor Crfagc which may be provided externally, may be provided in a single-chip direct-conversion low-IF tuner for Digital Audio Broadcast (DAB) and/or terrestrial digital multimedia broadcast (T-DMB) applications. The baseband device may be provided separately from or integrated with such a tuner. An embodiment may for example cover input frequencies within 168 MHz-240 MHz (VHF-III), 1452 MHz-1492 MHz (L-band), and/or 87 MHz to 108 MHz (FM), and/or may be configured to operate normally with a maximum receiver input power of, e.g., substantially 0 dBm.

Considering an embodiment in more detail, each of the amplifiers A1, A2 of the RF and IF stage, respectively, preferably comprise a voltage controlled amplifier. The RF amplifier A1 can be considered as a pre-amp, while the IF amplifier A2 is controlled by means of an amplitude detector (not shown; may be in the baseband processor/demodulator) to ensure that the output to a processor/demodulator has substantially constant amplitude.

As shown for example in FIG. 1b, the RF amplifier gain control signal is provided by means of a voltage Vrfagc on a capacitor Crfagc, which is charged by a current source I1 and/or discharged by a current source I2. The RF stage further comprises the power detector PD that controls the two current sources dependent on a power level at the RF stage output, i.e., the power level of an intermediate signal.

Generally at least one of the current sources I1 and I2 will always be on, i.e., conducting current. During normal, interference-free operation, I1 is on and I2 is off. The voltage limiting function of the digital diode D1 is effective in normal operation despite I1, the current of which may be diverted to ensure that the voltage Vrfagc on the capacitor Cagc remains at substantially the intended fixed difference (limit value) relative to Vifagc, i.e., tracks/follows Vifagc. Moreover, the voltage limiter circuitry is preferably configured to effectively override the current sources as necessary so that a voltage difference between Vrfagc and Vifagc greater than the intended limit value never occurs.

As shown for example in FIG. 1b, the power detector may provide a signal to turn a capacitor discharge current I2 on (and, preferably, I1 off) when the detected power reaches or exceeds a threshold Pth. In this way, a high power input to circuitry subsequent to the RF amp and consequent non-linear behaviour may be avoided.

As discussed above, the 'digital diode' circuitry linking Vrfagc and Vifagc forms a (preferably programmable) voltage limiter and is shown in FIGS. 1a and 1b. (In other embodiments, the circuitry may analogue and/or digital, and/or comprise a conventional diode and/or form a non-programmable voltage limiter). Under normal conditions, i.e., without interference, the voltage limiter preferably ensures that the RF gain control signal Vrfagc does not differ from the IF gain control signal by more than a fixed value, e.g., 0.44V. In other words, the 'digital diode' may in an embodiment act to limit the RE gain control signal on the basis of the IF gain control signal. Thus, the limiter may clamp Vrfagc when the difference between Vrfagc and Vifagc would otherwise exceed the limit. Advantageously, such linking circuitry may ensure that both amplifiers are operating in their respective linear regions over as wide a range of receiver input power as possible; in particular such that, as the receiver input power increases, the IF amplifier loop does not reach a non-linear limit to its operation before the power detector has changed state to reduce the RF amplifier gain.

In a specific implementation, the 'digital diode' may comprise a voltage monitor to determine when Vrfagc reaches or exceeds a fixed difference relative to Vifagc, e.g., is more than Vifagc+0.44V. With reference to FIG. 1b, this may be achieved by allowing the current sources I1 and I2 to be further controlled by the digital diode circuitry. Thus, the 'digital diode' may act to turn off the charge current source I1 or to divert the current of the charge source I1 away from the capacitor Crfagc, and/or to switch I2 on, when Vrfagc reaches or exceeds the fixed value relative to Vifagc. When the magnitude of Vrfagc−Vifagc is less than the substantially fixed limit value, the 'digital diode' may allow the current source I1 to charge the capacitor Crfagc.

Advantageously, the 'digital diode' may be embodied as a voltage follower, for example to control Vrfagc to remain at the fixed limit value relative to Vifagc (in the absence of any interference); in an embodiment, this may be achieved by the above control of current sources I1, I2 (FIG. 1b) by the digital diode circuitry.

Regardless, the 'digital diode' is most preferably configured such that a difference greater than the limit value does not occur in the presence or absence of interference.

In view of the above, in normal operation, if the detector input is below the power threshold and the current source I1 from the supply to the RF AGC pin is activated. As a result the RF AGC capacitor voltage is increased. However, due to the "digital diode" connection to the IF AGC pin, the capacitor voltage is preferably 'clamped' to follow at 0.44V above the IF AGC voltage.

On the other hand, if the power detector threshold is reached or exceeded, I2 is activated (I1 preferably off), to reduce RF gain until the detector threshold is no longer exceeded. If the power detector threshold is not exceeded, then I1 is active (I2 preferably off) until the detector threshold is reached or RF AGC voltage is 0.44V above the IF AGC voltage where it will be 'clamped' by the "digital diode".

Thus, absent interference, the power detector output can be considered as being 'off' and the RF gain control loop thus 'inactive'. At least conceptually, the RF gain is then controlled primarily by the IF gain control signal Vifagc by means of the 'digital diode', preferably embodied as a voltage follower. Thus, while the power detector remains 'off' and the input power increases, Vifagc may decrease to maintain constant output power to the processor/demodulator and Vrfagc similarly decreases to remain e.g. 0.44V above Vifagc. When the receiver input power reaches a high enough level that the power detector detects a power level at or above its threshold Pth, the power detector output changes state to reduce the RF gain by varying, e.g., reducing, Vrfagc. Thus, the RF loop becomes 'active'. Where the RF gain is reduced, the IF loop may compensate with higher gain to maintain the constant output.

In view of the above, the presence of interference at the receiver input may therefore be indicated by a changed relationship between, e.g., divergence of, the RF and IF amplifier gains and/or by divergence in the RF and IF amplifier gain control signals Vrfagc, Vifagc. In particular, the RF and IF gain control signals may cease to track each other.

Figure 5:
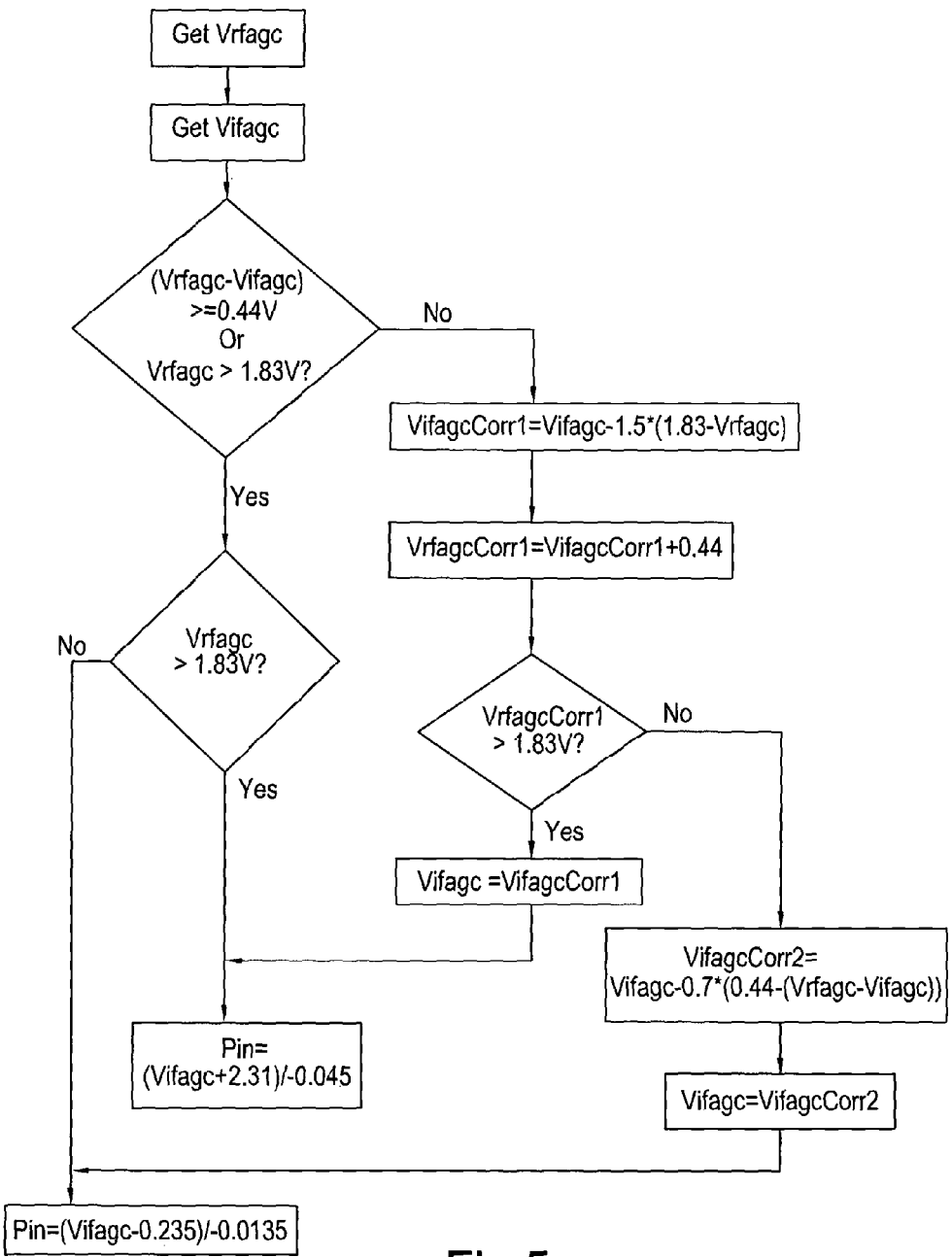
FIG. 5 shows a flow diagram summarising a correction algorithm of an embodiment.

In order to more accurately indicate the strength of intereference or of wanted RF received simultaneously with such interference, an algorithm may be applied based on the first and second control signals. In this regard, an RSSI indication process is shown in FIG. 5. The process first detects values of the gain control signals Vrfagc and Vifagc, and determines whether Vrfagc is tracking Vifagc (see, e.g., first decision block in FIG. 5, which indicates <=0.44V merely to take into account that a digital diode with a different, higher limit value may be used, although the difference between Vrfagc and Vifagc preferably should not exceed the limit value in any embodiment). Different correction calculations may be applied as shown in FIG. 5 to account for interference If Vrfagc-Vifagc is not equal to the limit value (e.g., 0.44V) associated with the 'digital diode' then it can be assumed that Vrfagc is not tracking Vifagc and the process flow proceeds through steps required for RSSI correction in the presence of interference (see, e.g., steps shown on the right hand side of FIG. 5). If on the other hand Vrfagc-Vifagc is not less than the fixed value then the received input power Pin is calculated directly on the basis of the measured value of Vifagc (see, e.g., steps shown on the left hand side of FIG. 5).

Figure 2:
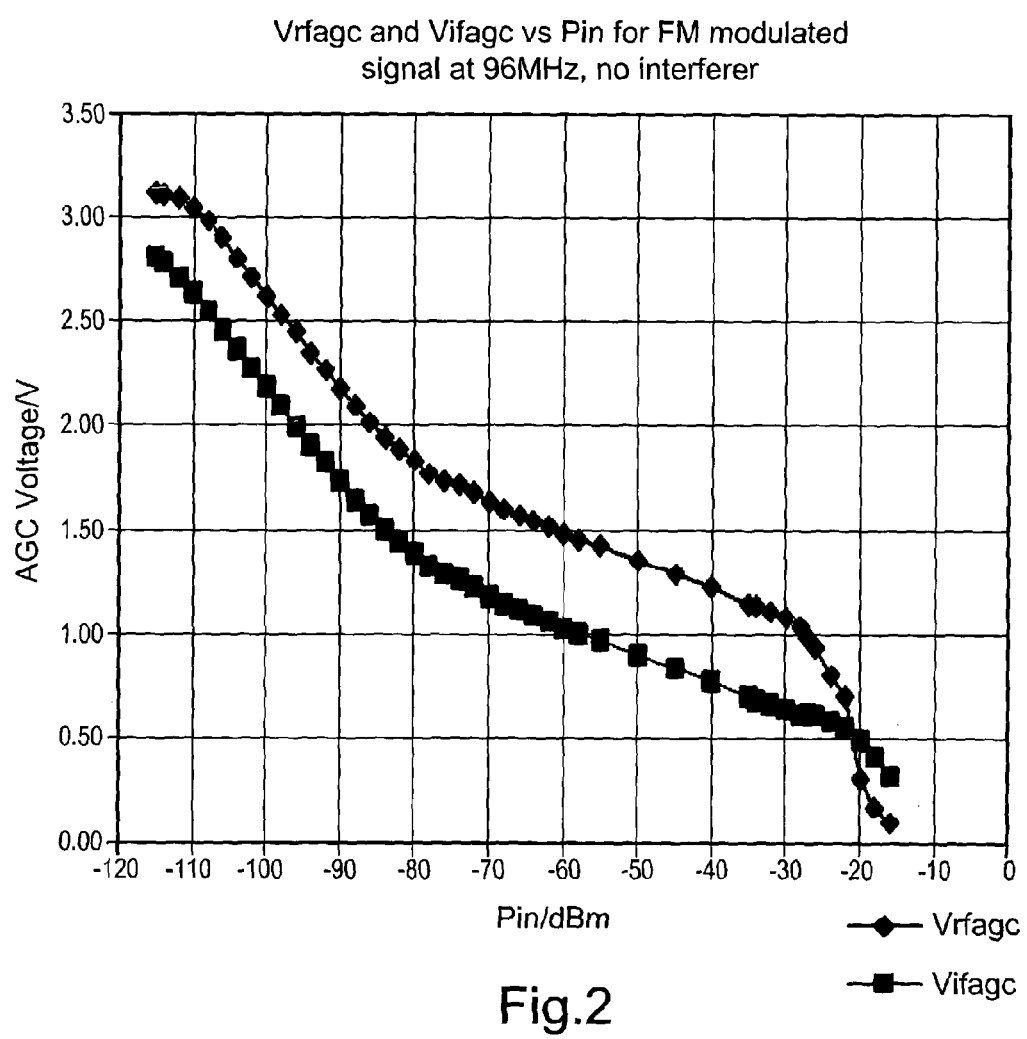
FIG. 2 shows a plot of RF and IF control voltages (Vrfagc and Vifagc) vs input power for with no interferer.

As shown in FIG. 5, the calculations may depend on which side of a knee value of at least the first amplifier A1 (e.g., an upper knee of an RF amplifier characteristic, which may comprise reduced or substantially flat gain vs control voltage slope (dB/V) below a lower knee control voltage (e.g. 0.8V) and above an upper knee control voltage (e.g. 1.83V)) the receiver is operating, e.g., whether Vrfagc is less than or greater than the value 1.83V that occurs at about −80 dBm as shown in FIG. 2. (A different knee value may be more appropriate depending on the actual RF amplifier in use; other embodiments may use more linear amplifier gain-voltage characteristics so that no account of such a knee need by taken).

Disregarding any lower knee, the 1.83V knee in the present embodiment separates two regions of operation, wherein Vifagc responds differently due to the different slopes of the RE amplifier characteristic in these regions. FIG. 5 provides alternative RSSI calculations directly from Vifagc (FIG. 5 left hand side) and alternative formulae for RSSI correction in the presence of interference (FIG. 5 right hand side) to account for these two regions of operation.

Thus, even in the absence of interference and in the presence of tracking, adjustment of the RSSI calculation directly from Vifagc may be required to account for a knee in an amplifier characteristic, e.g., if the RF amplifier is operating within a reduced, e.g., substantially zero, slope region of its characteristic. In such a region, an increase in receiver input power may reduce Vrfagc, but with no or relatively low impact on the RF amplifier gain, e.g., only the IF agc loop gain may change. In this case, the 0.44V difference between Vrfagc and Vifagc may be maintained but the IF amplifier gain may drop more rapidly than the RF amplifier gain in order to maintain the constant output to the processor/demodulator. The alternative Pin formulae "(Vifagc+2.31)/−0.045" and "(Vifagc−0.235)/−0.0135" may take this into account.

Similarly, the use of different correction factors Vifagccorr1 and Vifagccorr2 in FIG. 5 accounts for the different regions in the RF gain characteristic either side of the 1.83V knee value. Where, due to interference, tracking is not occurring (i.e., a substantially fixed Vrfagc−Vifagc is not maintained), the correction values VrfagcCorr1 and VifagcCorr1 may be first calculated on the assumption that the condition "Vrfagc>1.83V" would have been met in the absence of the interference. In other words, it is assumed that the RF amplifier would have been operating within the reduced, e.g., substantially zero, slope region of its characteristic. This is reflected in the inclusion of "1.83−Vrfacg" in the VifagcCorr1 formula "Vifagc−1.5*(1.83−Vrfagc)", the "1.83−Vrfacg" being considered as having no effect due to the reduced slope. The value 1.5 may reflect the different responses of the RF and IF loops. The "VrfagcCorr1=VifagcCorr1+0.44" formula recalculates Vrfagc to impose the condition that tracking is present, as reflected by the use of "+0.44".

After calculation of the Corr1 values on the assumption that the condition "Vrfagc>1.83V" would have been met in the absence of the interference, if the corrected Vrfagc value is >1.83V, the RSSI value (Pin) is then calculated using the corrected value VifagcCorr1 according to the above Pin formula applicable to the Vrfagc>1.83V scenario, i.e., "Pin=(Vifagc+2.31)/−0.045".

Otherwise, an alternative corrected Vifagc value (VifagcCorr2) is calculated to take into account the divergence of (Vrfagc−Vifagc) from the tracking fixed value (0.44V. Using the corrected value VifagcCorr2, the RSSI value Pin is then calculated according to the above Pin formula applicable to the Vrfagc<=1.83V scenario, i.e., "Pin=(Vifagc−0.235)/−0.0135".

However, generally an embodiment performing calculations to improve an RSSI may use an algorithm based on the first and second control signal values and having none or any one or more of the features of FIG. 5, in particular depending on the gain characteristics of specific amplifiers used on the control loops and any specific implementation of the limiter circuitry.

An alternative explanation an embodiment based on FIG. 1a and optionally using the process of FIG. 5 is now presented, the embodiment optionally with any one of more of the detailed features shown in FIG. 1b and/or 1c.

As shown in FIG. 1a, the architecture has two feedback loops to control the signal level in the receiver: Loop1 and Loop2. The purpose of the first loop Loop1 is to control the RF input gain so that the signal level does not become too large causing the input to become nonlinear. This loop consists of a detector PD1 to monitor the signal level and a voltage controlled variable gain low noise amplifier A1 to control the signal level. The loop operates by monitoring the signal level and, once that signal level reaches a defined limit, reducing the amplifier gain to keep the signal level at that defined limit.

The receiver is not "selective" in that any signal which is sufficiently large can cause the low noise amplifier gain to be reduced. Hence, the RF gain control loop does not just react to a "wanted" signal, but can also be affected by an "interfering" signal.

The second feedback loop Loop2 controls the output to the signal processor/demodulator. Its purpose is to ensure that the output signal level is fixed at a defined maximum amplitude without overloading the processor/demodulator input. For the architecture shown in FIG. 1a, the amplitude detector is in the processor/demodulator which also provides the controlling voltage for the voltage controlled amplifier.

In the embodiment, the link D1 between the RF and IF control loops preferably ensures that the signal level is always under control and there is no possibility of the IF AGC loop reaching its limit before the RF AGC loop has been activated.

FIG. 2 shows a plot of the RE and IF AGC control voltages as the input power is increased with no interfering signal present. Specifically, FIG. 2 shows AGC voltages (Vrafgc and Vifagc; V) versus input power (Pin; dBm) for an FM modulated signal at 96 MHz and no interferer.

Some points to note from FIG. 2 are as follows:
a) the RF AGC is only active when the RF AGC voltage is between about 0.8 and 1.8 Volts. (This is a limitation of the implemented RF variable gain amplifier, i.e., the implemented gain of the RF variable gain amplifier is only changed when the controlling voltage is between 0.8 and 1.8 Volts. This is the characteristic of the integrated circuit being used. Embodiments of the RSSI method of this application are however applicable to any RF AGC characteristic, but would require the equations to be changed accordingly compared to those provided in relation to the present implementation. The amplifier may be inactive above a certain control voltage threshold due to e.g. gain saturation).
b) the RF AGC characteristic is 40 dB/V
c) the IF AGC is active when the IF AGC voltage is between 0 and 3 Volts.
d) the IF AGC characteristic is 20 dB/V.
e) the architecture is setup so that the RF AGC voltage is held at about 0.4V above the IF AGC voltage with no interferer.
f) with no interferer, it is possible to use the IF AGC (or the RF AGC) voltage as a measure of the input power, Pin. The plot in FIG. 2 shows the following:
a) up to about −85 dBm, the slope is 20 dB/V as only the IF AGC is active in this range.
b) between about −85 and −25 dBm, the slope is 60 dB/V as both the IF AGC (with 20 dB/V characteristic) and RF AGC (with 40 dB/V characteristic) are active.
c) after about −20 dBm, only the IF AGC is active, and the characteristic reverts back to 20 dB/V.

Figure 3:
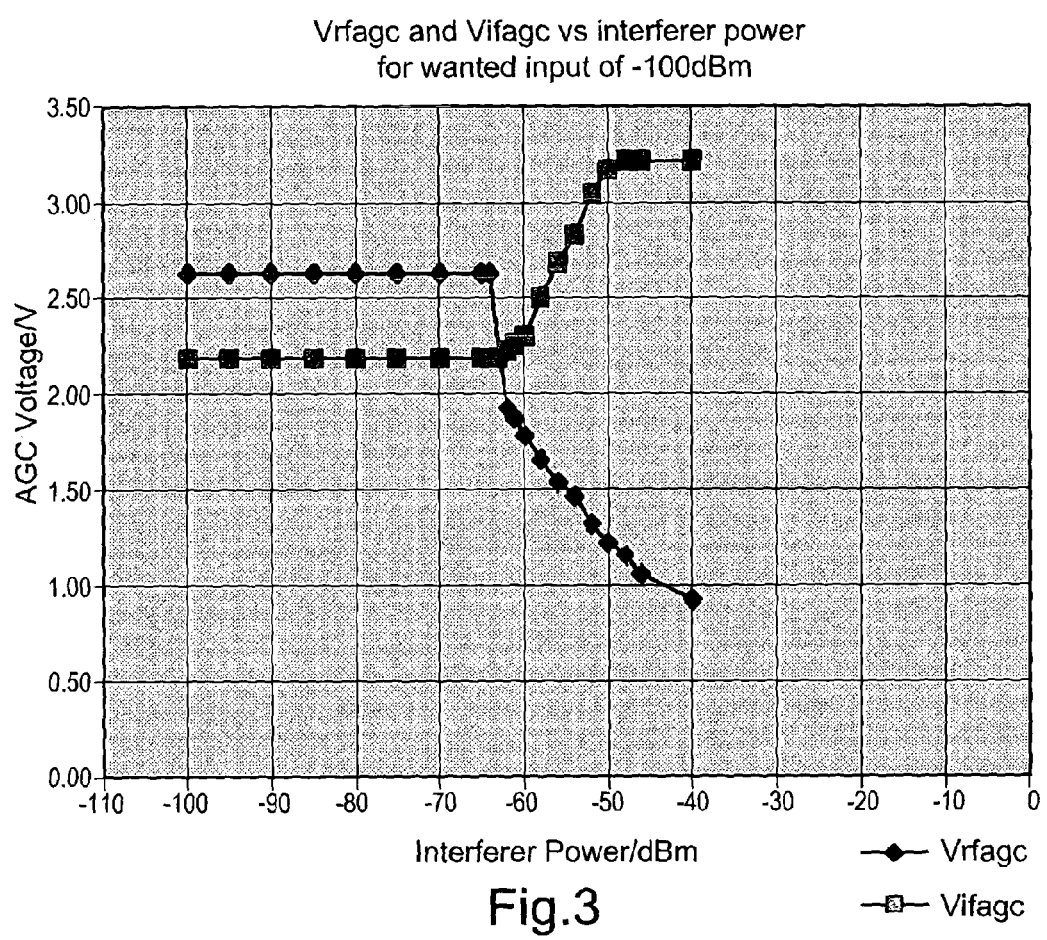
FIG. 3 shows RF and IF AGC voltages (Vrfagc, Vifagc) versus interferer power for wanted input of −100 dBm.
Figure 4:
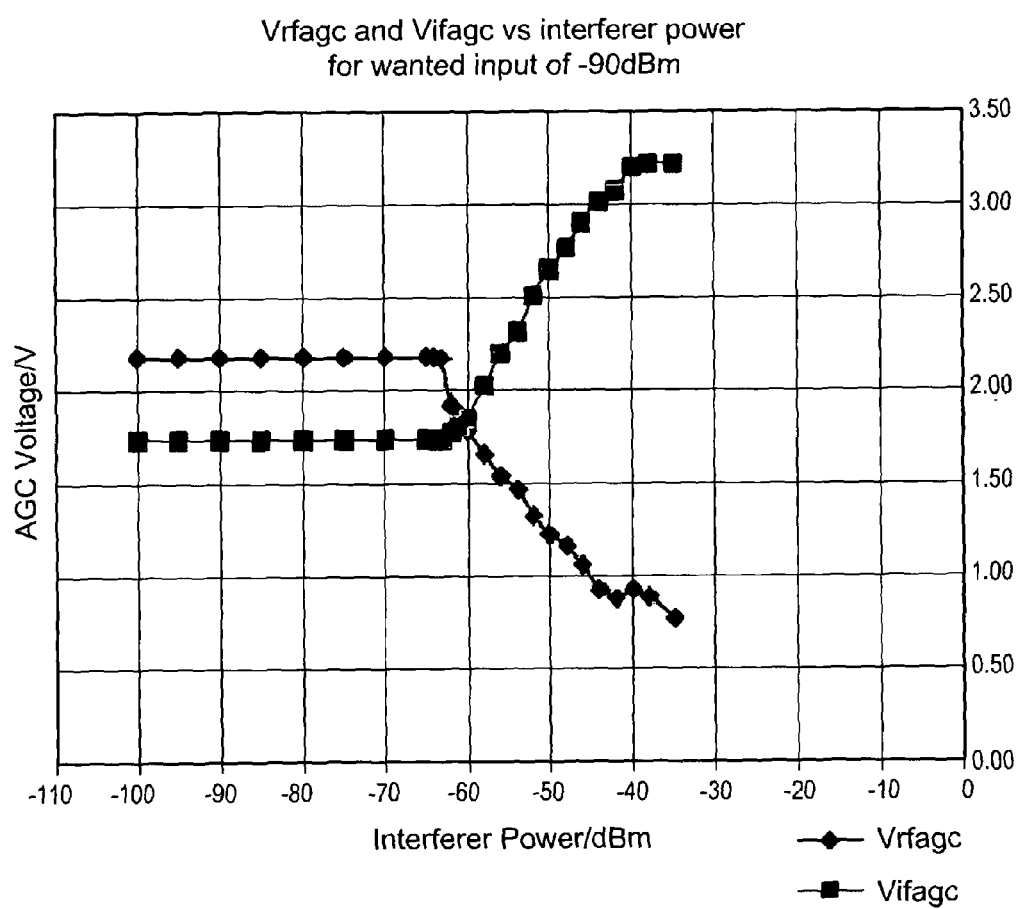
FIG. 4 shows RF and IF AGC voltages (Vrfagc, Vifagc) versus interferer power for wanted input of −90 dBm.

In the absence of interference, the "Received Signal Strength" may be validly determined by the gain control signal to the second amplifier A2. However, if an interferer is present which is of sufficient power to exceed the RF AGC power detector threshold, then the RF gain will be reduced and the IF gain will compensate for this reduction in RF gain. This will result in a higher IF AGC voltage which will be equated to a lower "Received Signal Strength". This is illustrated in FIGS. 3 and 4 which show the effect of an interferer on the RF and IF AGC voltages as an interferer is added and varied in power. FIG. 3 shows the effect when the wanted input power is −100 dBm and FIG. 4 when the wanted input power is −90 dBm.

Each of FIGS. 3 and 4 show that as soon as the interferer power reaches about −63 dBm (the RF detector threshold at the input), then the RF AGC voltage drops to reduce the RF gain. As a result, the IF AGC loop increases the IF gain to compensate for the loss in gain to keep the signal level at the IF output at its desired level. This then results in an incorrect value for the wanted "Received Signal Strength".

An embodiment provides a correction algorithm that uses the RF and IF AGC voltages to determine whether the "Received Signal Strength" has been affected by an interfering signal and if so, correct for the effect of the interferer to generate the actual wanted "Received Signal Strength".

The correction algorithm is based on the following:
a) monitoring difference between RF and IF AGC voltages. If the RF AGC voltage is no longer 0.4V above the IF AGC voltage, then this indicates that there is an interferer present of sufficient amplitude to affect the RF gain;
b) using the change in the voltage difference between the RF and IF AGC voltages to determine the change in the RF and IF gain as a result of the interferer;
c) once change in gains has been established, calculating RF and IF AGC voltages that would have been seen with no interferer; and
d) using the resultant calculated RF and IF AGC voltages—which compensate for the effect of the interferer—to determine the "Received Signal Strength" of the wanted signal.

Such an algorithm advantageously allows to monitor the wanted signal strength and react to defined wanted signal levels. FIG. 5 shows a flow diagram summarising such an algorithm.

Referring in more detail to FIG. 5, the first decision box is determining if the difference between the RF and IF AGC voltages is <0.44V (i.e. is there an interferer present) and if so has the RF gain been changed (i.e. is Vrfagc<1.83V?—if so, then the interferer has changed the RF gain and as a result the IF gain and we need to adjust the IF AGC voltage accordingly to compensate for this.

The second decision box on the left (Vrfagc>1.83V) is to determine which part of the AGC characteristic (see FIG. 2) we are on and hence the relationship between the IFAGC voltage, Vifagc, and the input power.

Hence, if Vrfagc>1.83V, then we use "Pin=(Vifagc+2.31)/−0.045" or if Vrfagc<=1.83, then we use "Pin=(Vifagc−0.235)/−0.0135"

The decision box on the right "VrfagcCorr1>1.83V" is related to correcting the RF and IF AGC voltages to compensate for the effect of an interferer. The compensation depends on which part of the AGC characteristic we are on when the interferer is present. VifagcCorr1 corresponds to the corrected IF AGC voltage when the corrected RF AGC voltage is greater than 1.83 Volts and VifagcCorr2 corresponds to the corrected IF AGC voltage when the corrected RF AGC voltage is less than 1.83 Volts.

In terms of the equations:

$$\text{VifagcCorr1} = \text{Vifagc} - 1.5 * (1.83 - \text{Vrfagc}), \tag{a}$$

As stated above, this equation corresponds to the corrected IF AGC voltage on the assumption that the RF AGC voltage would have been above 1.83V without an interferer. The (1.83−Vrfagc) relates to the "active" change in RFAGC voltage (any change above 1.83 has no effect as gain of RF variable gain amplifier does not change when controlling voltage is above 1.83V). The 1.5 corresponds to difference in the gain characteristic (dB/Volt) of the RF and IF AGC loops, i.e., the gain of the RF variable gain amplifier is 1.5 greater than that of the IF variable gain amplifier. Hence, if the RF AGC voltage drops by 0.2V due to an interferer, then the IF AGC voltage will increase by 0.3V.

Roughly, the IF AGC gain characteristic is about 22 dB/V and the RF AGC gain characteristic is 33 dB/V.

$$VrfagcCorr1=VifagcCorr1+0.44, \quad (b)$$

The RF AGC voltage will always be 0.44V above the IF AGC voltage with no interferer. Hence, this should be the same for the corrected RF AGC voltage.

$$Vifagc-0.7*(0.44-(vriagc-Vifagc)), \quad (c)$$

This corresponds to the corrected IF AGC voltage, Vifagc-Corr2, when we are on the part of the AGC characteristic of FIG. 2 where both the RF and IF AGC loops are active. In this case, we have to separate the shift in the difference in AGC voltages (Vrfagc−Vifagc) from 0.44V into the shift in Vrfagc and Vifagc as a result of the interferer. The fact that the RF AGC gain characteristic is about 1.5 times that of the IF AGC means that about 1.5/2.5 (0.6) of the shift in voltage difference will be due to IF AGC and 1/1.5 (0.4) will be due to the RF AGC.

The equation actually uses 0.7 as opposed to 0.6 because this has been "fitted" to the measurements.

$$Pin=(Vifagc+2.31)/-0.045 \text{ and } Pin=(Vftagc-0.235)/-0.0135. \quad (d)$$

Figure 2A:
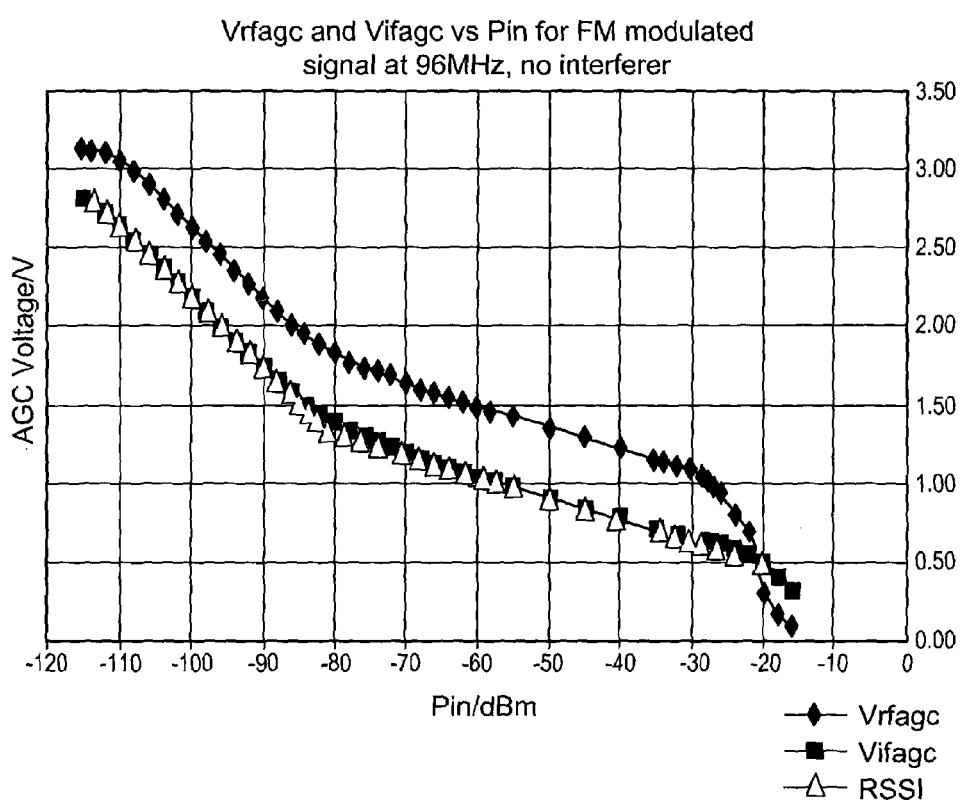
FIG. 2a shows a plot labelled as RSSI (triangle markers) generated by the equations Pin=(Vifagc+2.31)/−0.045 and Pin=(Vifagc−0.235)/−0.0135.

These equations have been obtained through "fitting" to the measurements shown in FIG. 2. FIG. 2a shows these 2 equations plotted—see label RSSI and triangle markers, the switch over point between the 2 equations being when Vrfagc=1.83V. (Generally, during normal interference-free operation, the receiver may operate in either substantially linear region of FIG. 2 or 2a, e.g., within −110 dB to −30 dB Pin).

FIGS. 6-13 illustrate the improvement in "Received Signal Strength" measurement as a result of the correction algorithm defined above.

Figure 6:
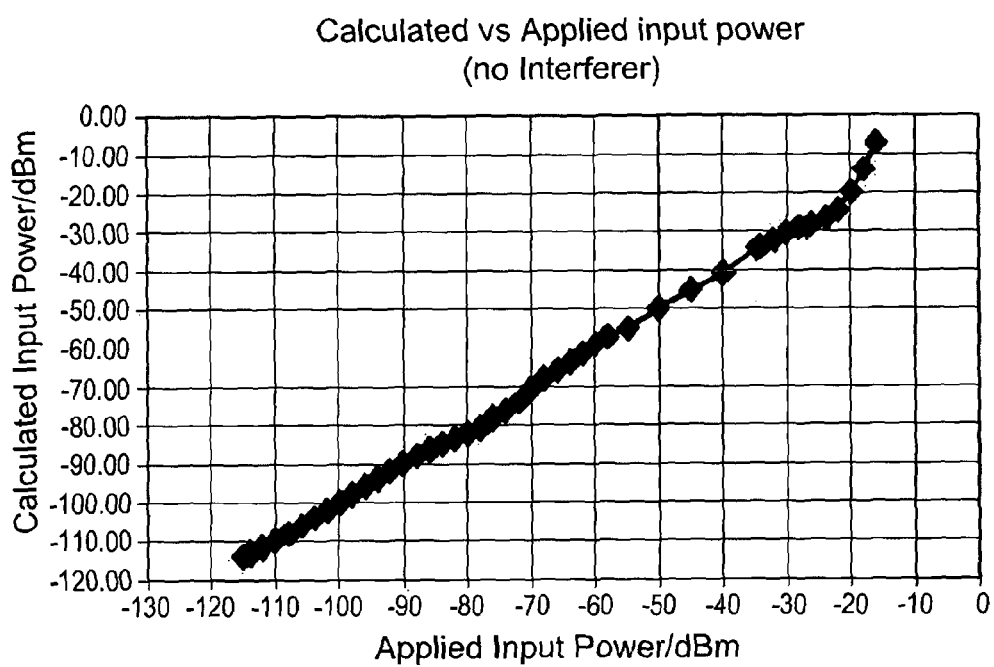
FIG. 6 shows calculated "Received Signal Strength" vs applied signal power with no interferer.
Figure 7:
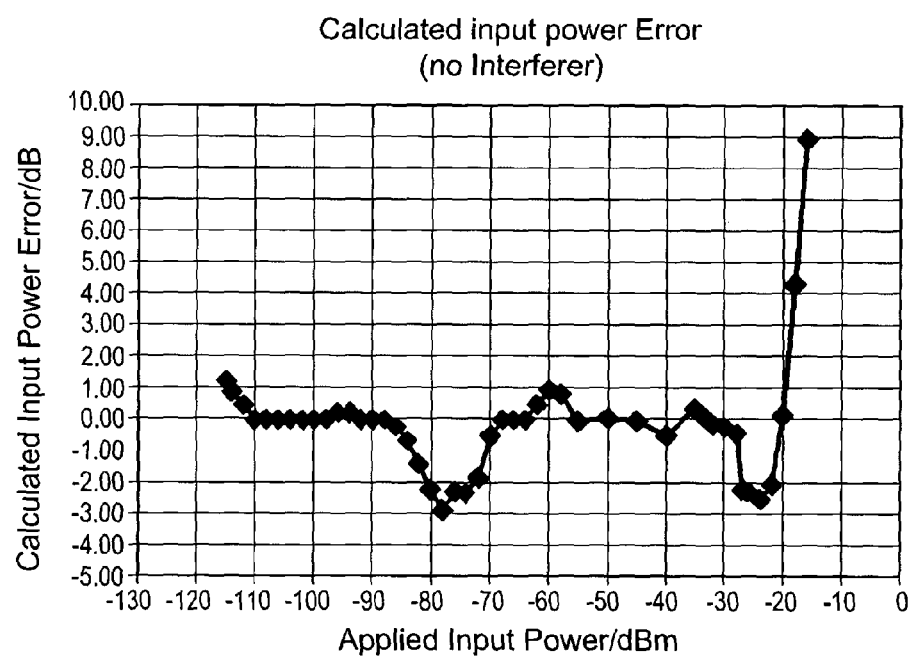
FIG. 7 shows associated calculation error vs applied signal power.

As mentioned in the brief descriptions above, FIG. 6 shows the calculated "Received Signal Strength" vs applied signal power with no interferer. FIG. 7 shows the associated calculation error vs applied signal power; specifically, the error in calculated "Received signal strength" vs applied signal power with no interferer.

Figure 8:
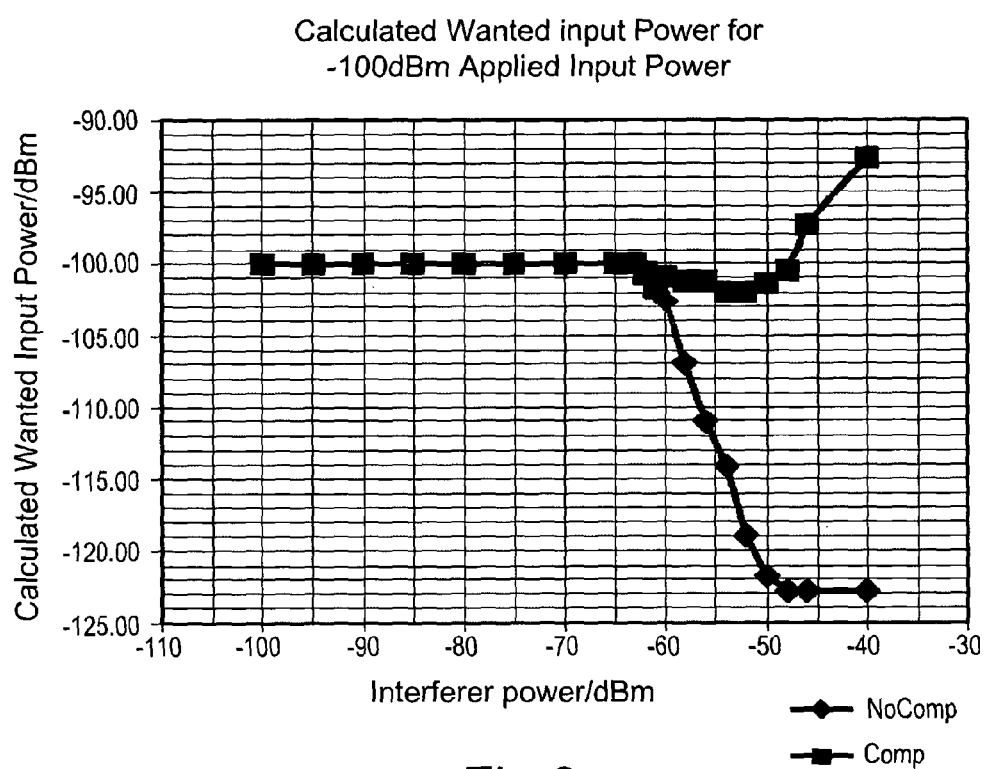
FIG. 8 shows calculated "Received Signal Strength" for a wanted signal of power −100 dBm with an interferer present, as the interferer power is increased.

FIG. 8 shows the calculated "Received Signal Strength" for a wanted signal of power −100 dBm with an interferer present, as the interferer power is increased. This shows the calculation with and without the compensation to take into account the effect of the interferer and illustrates the improvement seen as a result of the compensation.

Figure 9:
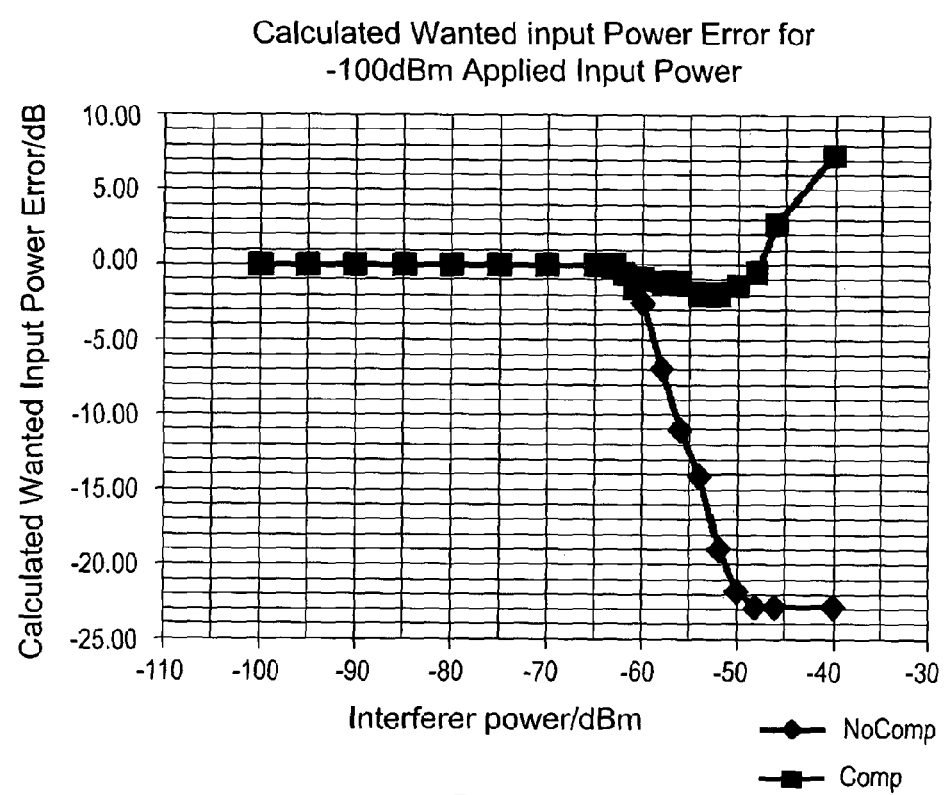
FIG. 9 shows associated calculation error vs interferer power.

FIG. 9 shows the associated calculation error vs interferer power, specifically the error in calculated "Received Signal Strength" for a wanted signal of power −100 dBm with an interferer present, as the interferer power is increased. (The plot shows results within and without calculation to compensate for the effect of the interferer).

Figure 10:
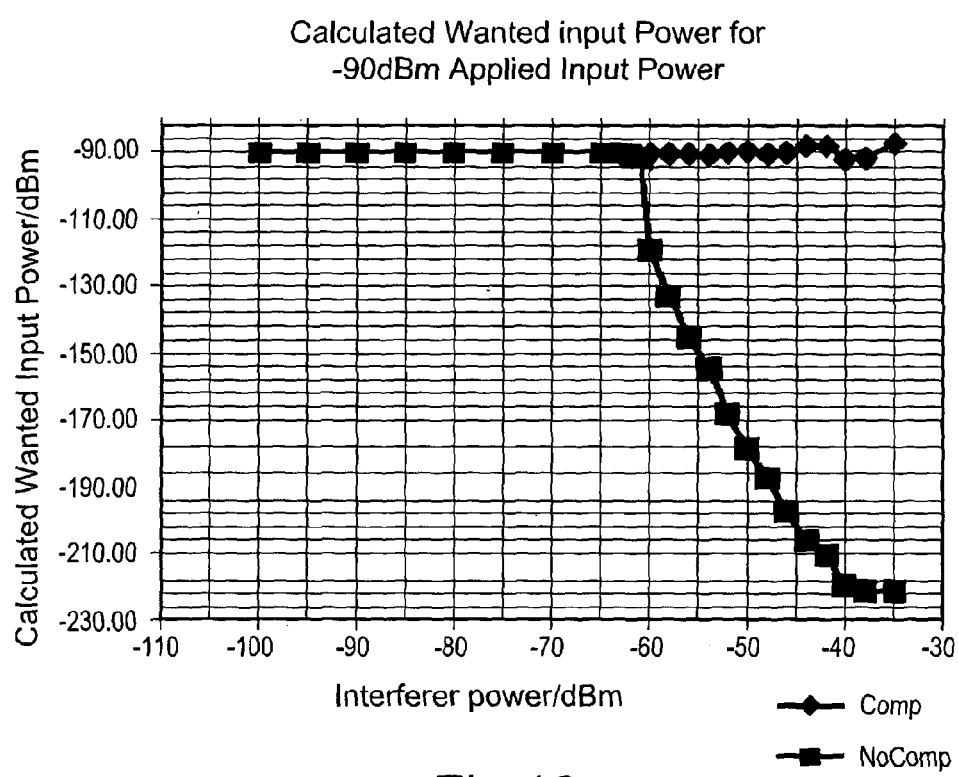
FIGS. 10 and 11 present the same type of measurements as presented in FIGS. 8 and 9, but for a wanted input power of −90 dBm.
Figure 11:
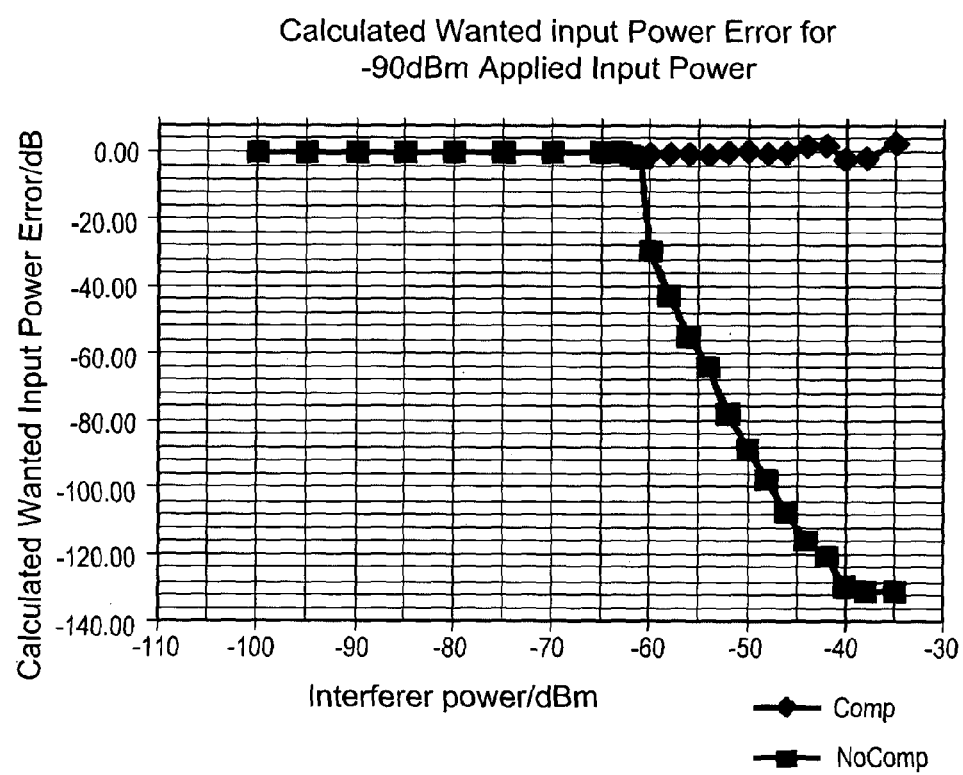

FIGS. 10 and 11 present the same measurements as presented in FIGS. 8 and 9, but for a wanted input power of −90 dBm. Specifically, FIG. 10 shows calculated "Received Signal Strength" for a wanted signal of power −90 dBm with an interferer present, as the interferer power is increased. (The plot shows results with and without calculation to compensate for effect of interferer). FIG. 11 shows error in calculated "Received Signal Strength" for a wanted signal of power −90 dBm with an interferer present, as the interferer power is increased. (This plot shows results with and without calculation to compensate for effect of interferer).

Figure 12:
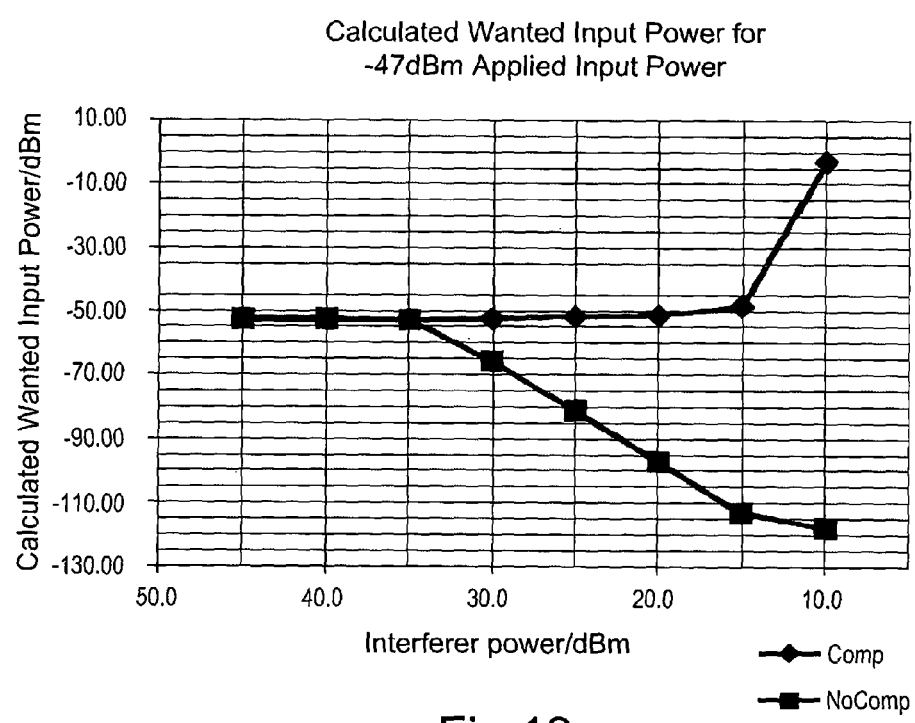
FIGS. 12 and 13 again present the same type of measurements as in FIGS. 8 and 9, but are for a wanted input power of −47 dBm.
Figure 13:
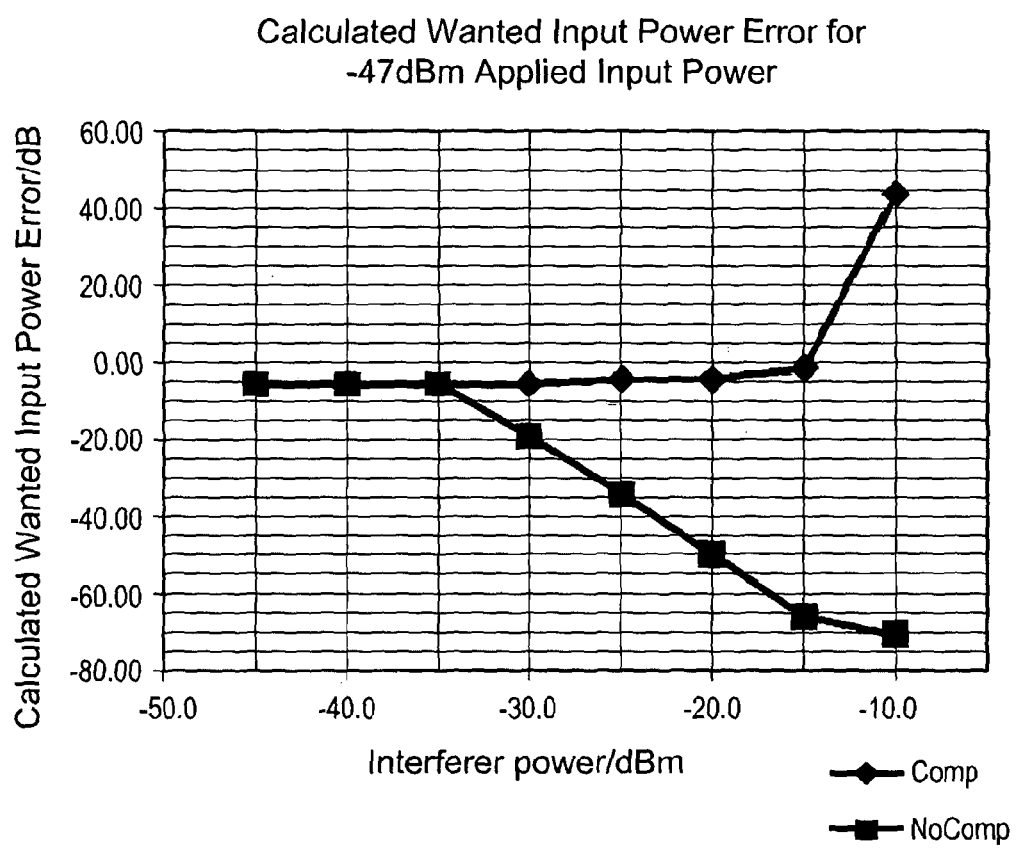

FIGS. 12 and 13 again present the same measurements, but are for a wanted input power of −47 dBm. Specifically, FIG. 12 shows calculated "Received Signal Strength" for a wanted signal of power −90 dBm with an interferer present, as the interferer power is increased. (The plot shows results with and without calculation to compensate for effect of interferer). FIG. 13 shows error in calculated "Received Signal Strength" for a wanted signal of power −90 dBm with an interferer present, as the interferer power is increased. (This plot shows results with and without calculation to compensate for effect of interferer).

It is further noted that:
1) The above calculations are based on using the actual RF and IF AGC voltages. In practice the baseband processor will generally use digital values for these voltages obtained through an A2D conversion. Hence, the accuracy of the calculation will depend on the resolution of the A2D converter.
2) The above measurements (with the exception of those for a wanted input power of −47 dBm (FIGS. 11 and 12) are based on one module. Hence the equations used to generate the "Received Signal Strength" have been derived for that one module. Hence, the above results do not take into account any production variation.

The above description of the implemented embodiment is further clarified by the following points:
1) When the input to the power detector, Pdet, is less than the power threshold, Pth, the current source I1 is "on" so that the capacitor is being charged. It's voltage, Vrfagc, will be clamped by the 'digital diode' to be 0.44V above the IF AGC voltage, Vifagc. (The 'digital diode' is part of the receiver IC in the present implementation, and function more like a voltage clamp. The behaviour of the so-called 'digital diode' circuitry indicates that the circuitry monitors the RF AGC voltage and either turns off the charging current (I1) or diverts it away from the capacitor, Crfagc, when the RF AGC voltage is 0.4(4) Volts above the IF AGC voltage preventing the capacitor voltage increasing further).
2) When the input power to the detector, Pdet, is greater than the power threshold, Pth, the current source I2 is "on" so that the capacitor is discharged. This causes the Vrfagc to drop and as a result the RF gain to be decreased. This happens until the RF gain has been reduced sufficiently for the power detector input to be equal to the power threshold.
3) For information, this implementation is chosen to allow the RF AGC response times to be defined.
4) Under normal operation, i.e. with no interferer, Vrfagc is always controlled by the IF AGC voltage and the power detector threshold is never exceeded. In this case Vifagc can be used to determine the input power.
5) When an interferer is present such that the power detector threshold is exceeded, then the current source I2 is enabled and Vrfagc is reduced and with it the RF gain until the power detector input is equal to the detector threshold. As a result of the RE gain reduction, the IF AGC loop increases the IF gain to restore the overall gain and the IF output voltage.
6) The gain of the voltage controlled RF amplifier is constant for control voltages above 1.83V. It then reduces as the control voltage reduces until the controlling voltage goes below about 0.8V when the gain remains constant. For this reason, there are 2 regions of operation, one when Vrfgac is greater than 1.83V, and the other when Vrfagc is less than or equal to 1.83V. This applies for both the calculation of the input power from the IF AGC voltage, Vifagc, and the correction due to the presence of an interferer.

The actual calculations will depend on the receiver being used. For example, for another receiver IC, the RE gain dependence on the controlling voltage may be different.

Further points are provided below:
1) Architecture is setup such that the RF and IF AGC voltages are always at a fixed voltage apart when there is no interferer. (This does not need to be 0.4(4)V). In this situation, RSSI can be determined from the IF AGC voltage.
2) If there is an interferer present of sufficiently large magnitude to affect the RSSI determination of 1), then this is identified by a change in the voltage difference between the RF and IF AGC voltages. This change is then used to determine the changes in RF and IF gain to allow the IF AGC voltage to be determined if the interferer did not affect the RF gain. This value can then be used to calculate the RSSI for the wanted signal.

An algorithm for RSSI calculation as described above can be adapted for any radio receiver (e.g., AM, FM, DAB, etc.) which has two AGC loops, one to control the signal level at the receiver input and the other which controls the wanted signal level into the demodulator. Thus, an embodiment is applicable to various receiver architectures.

An embodiment further provides processor control code to implement the above-described method, for example on an embedded processor. The code may be provided on a carrier such as a disk, CD- or DVD-ROM, programmed memory such as read-only memory (Firmware), or on a data carrier such as an optical or electrical signal carrier. Code (and/or data) to implement embodiments of the invention may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog (Trade Mark) or VHDL (Very high speed integrated circuit Hardware Description Language). As the skilled person will appreciate such code and/or data may be distributed between a plurality of coupled components in communication with one another.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of indicating signal quality at an input to a radio receiver, the method comprising:
    providing a radio receiver comprising:
        a first gain control loop having a first amplifier coupled to amplify a radio signal from a receiver input and having a first gain control input to receive a first gain control signal to control gain of said first amplifier, the first gain control loop having an output to output an intermediate signal, said first gain control loop further comprising a detector coupled to reduce said first amplifier gain when a level of said intermediate signal exceeds a threshold; and
        a second gain control loop having a second amplifier to amplify a signal on an input to said second amplifier, said second amplifier input coupled to said intermediate signal output, said second amplifier having a second gain control input to receive a second gain control signal to control gain of said second amplifier, wherein
        said first and second gain control inputs are coupled to limit a difference between the first and second gain control signals to be less than or substantially equal to a limit value; and
    indicating said signal quality on the basis of said first gain control signal and said second gain control signal.

2. The method of claim 1, further comprising:
    comparing said difference between said first gain control signal and said second gain control signal to said limit value; and
    said indicating said signal quality based on a result of said comparison.

3. The method of claim 1, wherein said indicating said signal quality comprises indicating presence of interference at said radio receiver input when said difference is not substantially equal to said limit value.

4. The method of claim 1, wherein said indicating said signal quality comprises indicating absence of interference at said radio receiver input when said difference is substantially equal to said limit value.

5. The method of claim 1, wherein said indicating said signal quality comprises indicating strength of interference at said radio receiver input dependent on said first and second gain control signals, wherein said interference comprises RF power received outside a frequency range,
    wherein said frequency range is preferably within 168 MHz-240 MHz, 1452 MHz-1492 MHz or 87 MHz to 108 MHz, more preferably said frequency range is a DAB channel frequency band or an FM channel frequency band.

6. The method of claim 1, wherein said indicating said signal quality comprises indicating strength of RF power received at said radio receiver input in a frequency range, said indicating said strength dependent on said difference, wherein said frequency range is preferably within 168 MHz-240 MHz, 1452 MHz-1492 MHz or 87 MHz to 108 MHz, more preferably said frequency range is a DAB channel frequency band or an FM channel frequency band.

7. The method of claim 1, further comprising:
    when said difference is not substantially equal to said limit value, indicating signal strength of a received radio signal by:
    detecting a value of said first gain control signal and a value of said second gain control signal;
    calculating an adjusted value of said second gain control signal on the basis of said detected value of said first gain control signal and said detected value of said second gain control signal; and
    determining said signal strength on the basis of said adjusted value.

8. The method of claim 7, wherein said calculating said adjusted value of said second gain control signal comprises:
    calculating an adjusted value of said first gain control signal on the basis of said adjusted value of said second gain control signal and said limit value; and
    comparing said adjusted value of said first gain control signal to a knee value of said first amplifier, said knee value being a control signal value at which a gain slope of said first amplifier changes with increased control signal value.

9. The method of claim 7, comprising:
    when said adjusted value of said first gain control signal is greater than a knee value of said first amplifier, determining said signal strength on the basis of said adjusted value that has been calculated on the basis of said adjusted value of said second gain control signal.

10. The method of claim 7 comprising:
when said adjusted value of said first gain control signal is less than a knee value of said first amplifier, calculating a further adjusted value of said second gain control signal based on said detected values of said first and second gain control signals, said calculating said further adjusted value based on a ratio of gain slopes of said first and second amplifiers; and
said determining said signal strength performed on the basis of said further adjusted value.

11. The method of claim 1, comprising:
detecting a value of said second gain control signal;
when said difference is substantially equal to said limit value, determining signal strength of a received radio signal directly on the basis of said detected value of said second gain control signal.

12. The method of claim 1, comprising:
when said difference is not substantially equal to said limit value, determining an interference strength by calculating an adjusted value of said second gain control signal on the basis of a detected value of said first gain control signal and a detected value of said second gain control signal and determining said interference strength on the basis of said adjusted value.

13. The method of claim 1, comprising:
detecting a value of said first gain control signal and a value of said second gain control signal;
calculating said gain of said first gain control loop and said gain of said second gain control loop on the basis of said detected values of said first and second gain control signals;
determining power of a signal at said radio receiver input on the basis of said calculated gains.

14. A non-transitory computer-readable storage medium having instructions stored thereon which cause the computer to perform the method according to claim 1.

15. A signal processor programmed to perform the method according to claim 1.

16. A radio receiver having an input to receive a radio signal, the receiver comprising:
a first gain control loop having a first amplifier coupled to amplify a radio signal from said receiver input and having a first gain control input to receive a first gain control signal to control gain of said first amplifier, the first gain control loop having an output to output an intermediate signal, said first gain control loop further comprising a detector coupled to reduce said first amplifier gain when a level of said intermediate signal exceeds a threshold;
a second gain control loop having a second amplifier to amplify a signal on an input to said second amplifier, said second amplifier input coupled to said intermediate signal output, said second amplifier having a second gain control input to receive a second gain control signal to control gain of said second amplifier;
a voltage limiter coupled between said first and second gain control inputs to limit a difference between the first and second gain control signals to be less than or substantially equal to a limit value;
a signal quality output circuit coupled to said first and second gain control signals and configured to indicate signal quality at said radio receiver input on the basis of said first and second gain control signals.

17. The radio receiver of claim 16, comprising:
a comparator to compare a difference between said first and second gain control signals to said limit value; and
said signal quality output circuit configured to indicate said signal quality on the basis of said comparison.

18. The radio receiver of claim 17, comprising:
a detector to detect a value of said second gain control signal;
said signal quality indicator circuit arranged to, when an output of said comparator indicates that said difference is substantially equal to said limit value, calculate signal strength of a radio signal at said radio receiver input directly on the basis of said detected value of said second gain control signal and to indicate said calculated signal strength.

19. The radio receiver of claim 17, comprising:
a detector to detect a value of said first gain control signal;
said signal quality indicator circuit arranged to, when an output of said comparator indicates that said difference is not substantially equal to said limit value, calculate an adjusted value of said second gain control signal on the basis of detected values of said first and second gain control signals, to calculate signal strength of a received radio signal on the basis of said adjusted value and to indicate said calculated signal strength.

20. The radio receiver of claim 16, wherein said first gain control loop comprises:
a mixer arranged to frequency down convert said radio signal amplified by said first amplifier and to output said down converted radio signal as said intermediate signal.

21. The radio receiver of claim 16, wherein said circuitry comprises:
a mixer arranged to frequency up convert said intermediate signal.

22. The radio receiver of claim 16, wherein said circuitry comprises:
a filter having a passband to reject frequency components arising due to interference, the filter preferably coupled between the intermediate signal output and said mixer arranged to frequency up convert, wherein said interference comprises frequencies outside a frequency band, said frequency band preferably a DAB or FM channel frequency band.

23. The radio receiver of claim 16, comprising a demodulator to demodulate an output of said second gain control loop, said second gain control loop comprising a level detector to detect a level of said output, the second gain control loop arranged to maintain said output level substantially constant.

24. The radio receiver having an input to receive a radio signal, the receiver comprising:
a first gain control loop having a first amplifier coupled to amplify a radio signal from said receiver input and having a first gain control input to receive a first gain control signal to control gain of said first amplifier, the first gain control loop having an output to output an intermediate signal, said first gain control loop further comprising a detector coupled to reduce said first amplifier gain when a level of said intermediate signal exceeds a threshold;
a second gain control loop having a second amplifier to amplify a signal on an input to said second amplifier, said second amplifier input coupled to said intermediate signal output, said second amplifier having a second gain control input to receive a second gain control signal to control gain of said second amplifier;
a voltage limiter coupled between said first and second gain control inputs to limit a difference between the first and second gain control signals to be less than or substantially equal to a limit value;
a detector to detect a value of said first gain control signal;
a detector to detect a value of said second gain control signal; and
a signal quality indicator circuit arranged to, when said detector coupled to reduce said first amplifier gain indicates said level of said intermediate signal exceeds said threshold, calculate an adjusted value of said second gain control signal on the basis of said detected values of said first and second gain control signals and to calculate signal strength of said received radio signal on the basis of said adjusted value.

* * * * *